United States Patent
Hoshino et al.

(10) Patent No.: US 12,312,691 B2
(45) Date of Patent: May 27, 2025

(54) METHOD OF MANUFACTURING POLYCRYSTALLINE SILICON ROD

(71) Applicant: Shin-Etsu Chemical Co., Ltd., Tokyo (JP)

(72) Inventors: Naruhiro Hoshino, Niigata (JP); Masahiko Ishida, Niigata (JP); Tetsuro Okada, Niigata (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 265 days.

(21) Appl. No.: 16/899,510

(22) Filed: Jun. 11, 2020

(65) Prior Publication Data

US 2020/0392627 A1 Dec. 17, 2020

(30) Foreign Application Priority Data

Jun. 17, 2019 (JP) .................................. 2019-111794

(51) Int. Cl.
*C23C 16/56* (2006.01)
*C23C 16/24* (2006.01)

(52) U.S. Cl.
CPC .............. *C23C 16/56* (2013.01); *C23C 16/24* (2013.01)

(58) Field of Classification Search
CPC ..... C23C 16/56; C23C 16/24; C23C 16/4418; C01B 33/035
See application file for complete search history.

(56) References Cited

U.S. PATENT DOCUMENTS

| 5,976,481 A | 11/1999 | Kubota et al. |
| 6,221,155 B1 | 4/2001 | Keck et al. |
| 2008/0286550 A1 | 11/2008 | Sofin et al. |
| 2015/0017349 A1* | 1/2015 | Netsu ................. C23C 16/50 427/588 |

(Continued)

FOREIGN PATENT DOCUMENTS

| JP | S6374909 A | 4/1988 |
| JP | 2002508294 A | 3/2002 |
| JP | 2008285403 A | 11/2008 |

(Continued)

OTHER PUBLICATIONS

Japanese Office Action for Japanese Patent Application 2019-111794, issued on May 10, 2022 and English translation provided by Global Dossier.

*Primary Examiner* — Michael G Miller
(74) *Attorney, Agent, or Firm* — Ladas & Parry, LLP

(57) ABSTRACT

There is provided a method of manufacturing a polycrystalline silicon rod suitable as a raw material for manufacturing monocrystalline silicon by a FZ process. The method of manufacturing a polycrystalline silicon rod according to the present invention is a method of manufacturing a polycrystalline silicon rod by Siemens process, and includes a post-deposition energization step of, after an end of a deposition step of polycrystalline silicon, performing energization under a condition that provides a skin depth D shallower than a skin depth $D_0$ provided at a time when the deposition step ends. For example, the post-deposition energization step is performed by passage of current at a frequency f higher than a frequency $f_0$ of current that is passed at a time when the deposition step ends.

3 Claims, 7 Drawing Sheets

(56) References Cited

U.S. PATENT DOCUMENTS

2015/0037516 A1* 2/2015 Netsu ................. C23C 16/52
                                                  427/588
2015/0225246 A1   8/2015 Yilmaz et al.

FOREIGN PATENT DOCUMENTS

| JP | 2010180078 A | 8/2010 |
| JP | 2013170117 A | 9/2013 |
| JP | 2013170118 A | 9/2013 |
| JP | 2016138021 A | 8/2016 |
| WO | 9744277 A1 | 11/1997 |

* cited by examiner

METHOD OF MANUFACTURING POLYCRYSTALLINE SILICON ROD

CROSS-REFERENCE TO RELATED APPLICATION

The present application claims priority to Japanese Application No. 2019-111794 filed on Jun. 17, 2019, the disclosure of which is incorporated herein by reference in its entirety.

BACKGROUND

Technical Field

The present invention relates to a polycrystalline silicon rod grown by Siemens process, and particularly to a method of manufacturing a polycrystalline silicon rod suitable as a raw material for manufacturing monocrystalline silicon by a floating-zone (FZ) process.

Related Art

The present application claims the priority of Japanese Patent Application No. 2019-111794 filed on Jun. 17, 2019, the contents of which are entirely incorporated by reference.

Background of the Art

Polycrystalline silicon is a raw material of monocrystalline silicon for manufacturing semiconductors or silicon for manufacturing solar batteries. Siemens process is known as a method of manufacturing polycrystalline silicon. According to this process, typically, a silane-based raw-material gas is brought into contact with a silicon core wire being heated, thereby depositing polycrystalline silicon on a surface of the silicon core wire by a chemical vapor deposition (CVD) process.

According to Siemens process, two silicon core wires are put vertically and one silicon core wire is put horizontally, thereby forming an assembly in an inverted-U shape. Then, opposite ends of the assembly are connected to a core-wire holder and are fixed to a pair of metallic electrodes placed on a base plate. Typically, it is so designed that plural sets each including silicon core wires in an inverted-U shape are placed in a reaction furnace.

The silicon core wires in an inverted-U shape are energized to be heated to a deposition temperature, and a mixture of a trichlorosilane gas as a raw-material gas, for example, and a hydrogen gas, is brought into contact with the silicon core wires. This causes vapor-phase growth of polycrystalline silicon on the silicon core wires, so that a polycrystalline silicon rod having a desired diameter is formed in an inverted-U shape.

For manufacture of monocrystalline silicon by a FZ process, respective ends of two polycrystalline silicon rods being put vertically in polycrystalline silicon formed in an inverted-U shape are cut away, thereby forming cylindrical polycrystalline silicon rods. Those are used as a raw material for growing monocrystalline silicon. As a matter of course, a cylindrical polycrystalline silicon rod as a raw material having a larger length is more suitable because such a rod allows a greater length of monocrystalline silicon to be drawn by one operation.

JP 2008-285403 A, which discusses manufacture of a polycrystalline silicon rod having a diameter larger than 120 mm, suggests lowering a temperature of deposition reaction of polycrystalline silicon at a point in time when the polycrystalline silicon rod has a certain diameter, in order to prevent a crack or breakage from occurring in the rod due to thermal stress caused by a difference in temperature between an inside part and a surface of the rod.

Meanwhile, WO 97-44277 A, which intends to reduce distortion present in a polycrystalline silicon rod, discloses a method in which, after deposition reaction of silicon, the polycrystalline silicon rod is energized in the presence of a hydrogen gas or an inert gas to be heated until at least a part of a surface of the polycrystalline silicon rod has a temperature of 1030° C. or higher.

Further, JP S63-74909 A, which intends to prevent occurrence of a crack, suggests a method in which high-frequency current is directly passed through a silicon core rod to heat the silicon core rod in a deposition step of polycrystalline silicon, thereby causing a large amount of current to flow near a surface of the silicon rod using the skin effects.

Further, JP 2002-508294 A intends to heat a peripheral region of a silicon rod connected to an electrode group to a higher temperature than an inside part of the silicon rod. To this end, high-frequency alternating current having a frequency that is high enough to produce coating effects is supplied as a larger part of current flowing through an outer surface adjacent to the peripheral region of the silicon rod in a deposition step of polycrystalline silicon. Then, JP 2002-508294 A reports that a polycrystalline silicon rod that has a stress lower than 11 MPa and has a maximum diameter of 300 mm can be obtained.

Further, JP 2013-170117 A and JP 2013-170118 A disclose in embodiments thereof lowering gradually a temperature to cool polycrystalline silicon while passing high-frequency current through the polycrystalline silicon under the same condition as that at the end of a deposition step of the polycrystalline silicon, thereby obtaining a polycrystalline silicon rod having no crack.

SUMMARY

However, the method described in JP 2008-285403 A requires reduction of a temperature of deposition reaction of polycrystalline silicon, which causes a problem of constraints on control of a physical-property value of a crystal to be obtained.

Further, in a case where a surface temperature of a rod is raised to 1030° C. or higher by heating at a frequency of 50 Hz or 60 Hz in the same manner as in the method disclosed in WO 97-44277 A, there arises a problem of an increased risk of crystal melting because of such a diameter of the rod as provided after a deposition step.

The methods that use the skin effects of high-frequency current as disclosed in JP S63-74909 A, JP 2002-508294 A, JP 2013-170117 A, and JP 2013-170118 A are effective for reducing a difference in temperature between a surface and a central part of a polycrystalline silicon rod.

Nonetheless, from the description in the scope disclosed in the above-mentioned references, it is not necessarily clear what energization state or what heating condition is appropriate in a step after a deposition step of polycrystalline silicon, in order to prevent occurrence of a crack or breakage.

The present invention has been devised in view of the above-described problems, and it is an object thereof to provide a technique of preventing occurrence of a crack or breakage by optimizing various conditions of a step after a deposition step of polycrystalline silicon.

To overcome the above-described problems, a method of manufacturing a polycrystalline silicon rod in a first aspect according to the present invention is a method of manufacturing a polycrystalline silicon rod by Siemens process and includes a post-deposition energization step of, after an end of a deposition step of polycrystalline silicon, performing energization under a condition that provides a skin depth D shallower than a skin depth $D_0$ provided at a time when the deposition step ends.

In another aspect, the post-deposition energization step is performed by passage of current at a frequency f higher than a frequency $f_0$ of current that is passed at a time when the deposition step ends.

Further, in another different aspect, the post-deposition energization step is included as a step performed during a period in which the polycrystalline silicon rod is cooled to a room temperature after the deposition step ends, and a period, in which the frequency f for energization in the post-deposition energization step is set to be higher in response to lowering of a crystal temperature of the polycrystalline silicon rod, is provided.

Preferably, the skin depth D is shallower than a radius R of the polycrystalline silicon rod provided after the deposition step ends.

A method of manufacturing a polycrystalline silicon rod in a second aspect according to the present invention is a method of manufacturing a polycrystalline silicon rod by Siemens process, and includes a post-deposition heat treatment step of, after an end of a deposition step of polycrystalline silicon, treating the polycrystalline silicon rod at a temperature T that is higher than a crystal temperature $T_0$ at a time when the deposition step ends and is lower than a melting temperature of polycrystalline silicon, wherein the post-deposition heat treatment step is performed while the polycrystalline silicon rod is energized under a condition that provides a skin depth D shallower than a radius R of the polycrystalline silicon rod provided after the deposition step ends.

The present invention provides a method of manufacturing a polycrystalline silicon rod suitable as a raw material for manufacturing monocrystalline silicon by a FZ process, while effectively preventing occurrence of a crack or breakage.

DETAILED DESCRIPTION

Figure 1:
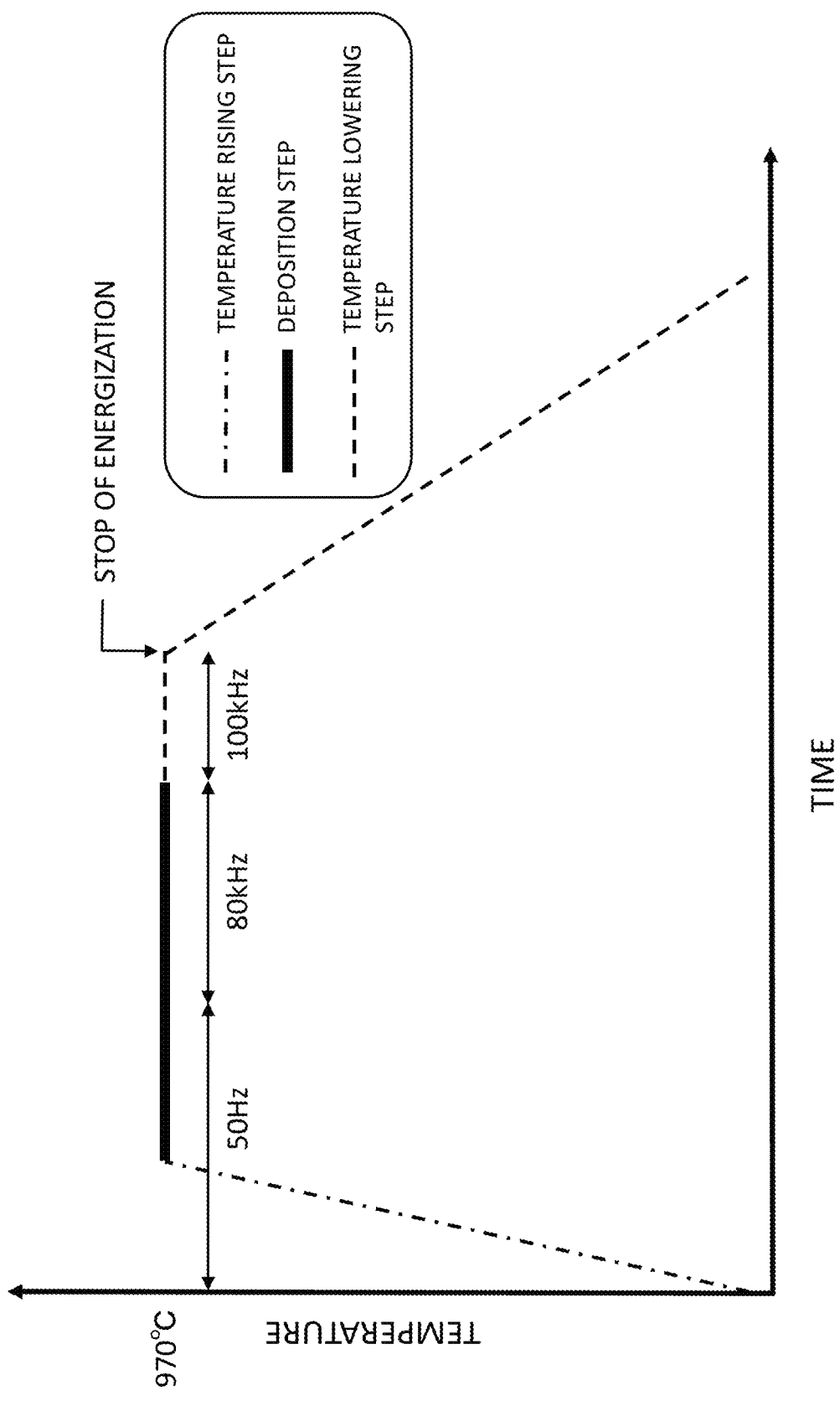
FIG. 1 is a view for conceptually explaining an outline of a process in a first example.

Hereinafter, an embodiment for carrying out the present invention will be described.

The present inventors, in pursuit of studies on a method of manufacturing a polycrystalline silicon rod that is long enough to be suitably used as a raw material for manufacturing monocrystalline silicon by a FZ process, have concluded that it is difficult to satisfactorily suppress occurrence of a crack with the methods ever proposed.

Thus, the inventors, having further worked on the studies, have concluded that the probability of crack occurrence is reduced by passage of high-frequency current through a polycrystalline silicon rod under a condition that provides a skin depth shallower than a skin depth provided at the end of a deposition step of polycrystalline silicon, in a cooling step after the deposition step.

A skin depth $\delta$ (m) is given by $\delta=[\rho/(\pi \cdot f \cdot \mu)]^{1/2}$. In this equation, $\rho$ represents resistivity ($\Omega$m), f represents a frequency (Hz), and $\mu$ represents permeability (H/m) of a conductor.

Hence, a skin depth can be reduced by increase of a frequency of current to be supplied. Further, the electrical resistivity of a silicon crystal becomes lower as a temperature rises. Thus, a skin depth can be made smaller (made shallower) also by rise of a crystal temperature. In other words, for reduction of a skin depth, there can be provided two options (conditions) of increasing a frequency of current and of raising a crystal temperature. Additionally, in the case of the latter option, a crystal temperature is set at a temperature lower than a melting temperature of polycrystalline silicon to prevent melting of silicon.

The present inventors have found that energization under the above-described two conditions are effective for suppressing occurrence of a crack not only in a deposition step of silicon, but also in a step after the deposition step (the step will be referred to as a "cooling step" for the sake of convenience), and have devised the present invention.

The shallower a skin depth is, the larger amount of current flows near a surface of a polycrystalline silicon rod, and no current flows in an inside region of the rod. Thus, a difference in temperature between a surface and a central part of the polycrystalline silicon rod is reduced. This results in suppression of occurrence of a crack.

Additionally, in the present invention, high-frequency current is not necessarily required to flow at all times in a step of cooling a polycrystalline silicon rod to a room temperature (that is, a "cooling step" referred to in the present specification) after a deposition step. High-frequency current may be caused to flow under a condition that reduces a skin depth only in a part of a period for cooling a polycrystalline silicon rod to a room temperature.

For example, it may be so designed that current at a frequency of 50 Hz or 60 Hz, for example, is passed during deposition reaction and high-frequency current flows under a condition that reduces a skin depth in a predetermined period after the deposition reaction.

When current at a frequency of 50 Hz or 60 Hz flows, a skin depth becomes equal to or larger than a radius of a polycrystalline silicon rod. Thus, current flows through not only a surface of the polycrystalline silicon rod, but also a central part thereof, which increases a difference in temperature between the surface and the central part of the polycrystalline silicon rod. This then increases the likelihood of crack occurrence. However, by causing high-frequency current to flow under a condition that reduces a skin depth in at least a predetermined period after the end of deposition reaction, it is possible to produce a state in which a difference in temperature between a surface and a central part of a polycrystalline silicon rod is small. This relieves thermal distortion, thereby suppressing occurrence of a crack.

As described above, the electric resistivity of a silicon crystal becomes lower as a temperature rises, and conversely, it becomes higher as a temperature decreases. Further, a skin depth becomes larger (deeper) as the electrical resistivity becomes higher.

Thus, in passing high-frequency current in a "cooling step", it is preferable to increase a frequency of the current to be passed, in response to lowering of a crystal temperature. Further, it is also preferable to heat a polycrystalline silicon rod obtained through crystal growth at a temperature lower than a melting temperature and reduce the electrical resistivity of a surface of the polycrystalline silicon rod without changing a frequency of current to be passed, to energize the polycrystalline silicon rod under a condition that provides a skin depth shallower than a skin depth $D_0$ provided at the end of a deposition step. Moreover, it is also preferable to increase a frequency of current to be passed and heat a polycrystalline silicon rod obtained through crystal growth at a temperature lower than a melting temperature.

The above-described method of manufacturing a polycrystalline silicon rod can be summarized as follows.

That is, the method of manufacturing a polycrystalline silicon rod according to the present invention is a method of manufacturing a polycrystalline silicon rod by Siemens process, and includes a post-deposition energization step of, after an end of a deposition step of polycrystalline silicon, performing energization under a condition that provides a skin depth D shallower than a skin depth $D_0$ provided at a time when the deposition step ends.

For example, the post-deposition energization step is performed by passage of current at a frequency f higher than a frequency $f_0$ of current that is passed at a time when the deposition step ends.

Further, in a certain aspect, the post-deposition energization step is included as a step that is performed until the polycrystalline silicon rod is cooled to a room temperature after the deposition step ends, and there is provided a period in which a frequency f for energization in the post-deposition energization step is set to be higher in response to lowering of a crystal temperature of the polycrystalline silicon rod.

Preferably, the skin depth D is shallower than a radius R of the polycrystalline silicon rod provided after the deposition step ends.

A method of manufacturing a polycrystalline silicon rod in another aspect according to the present invention is a method of manufacturing a polycrystalline silicon rod by Siemens process, and includes a post-deposition heat treatment step of, after an end of a deposition step of polycrystalline silicon, treating the polycrystalline silicon rod at a temperature T that is higher than a crystal temperature $T_0$ at a time when the deposition step ends and is lower than a melting temperature of polycrystalline silicon. Further, while the post-deposition heat treatment step is performed, the polycrystalline silicon rod is energized under a condition that provides a skin depth D shallower than a radius R of the polycrystalline silicon rod provided after the deposition step ends.

EXAMPLES

First Example

FIG. 1 is a view for conceptually explaining an outline of a process in a first example. A mixture of a trichlorosilane gas as a raw-material gas and a hydrogen gas was supplied and the temperature was kept at 970° C., so that a polycrystalline silicon rod having a diameter of 160 mm was grown by Siemens process. A frequency of current to be passed was set at a low frequency of 50 Hz until the diameter of a crystal became equal to 80 mm, and subsequently the frequency was changed to a high frequency of 80 kHz. After a deposition step of polycrystalline silicon ended, the polycrystalline silicon rod was energized with the frequency being set at 100 kHz for one hour in order to achieve energization under a condition that provides a skin depth D shallower than a skin depth $D_0$ provided at the end of the deposition step. Thereafter, energization was stopped and the polycrystalline silicon rod was cooled to a room temperature.

Second Example

Figure 2:
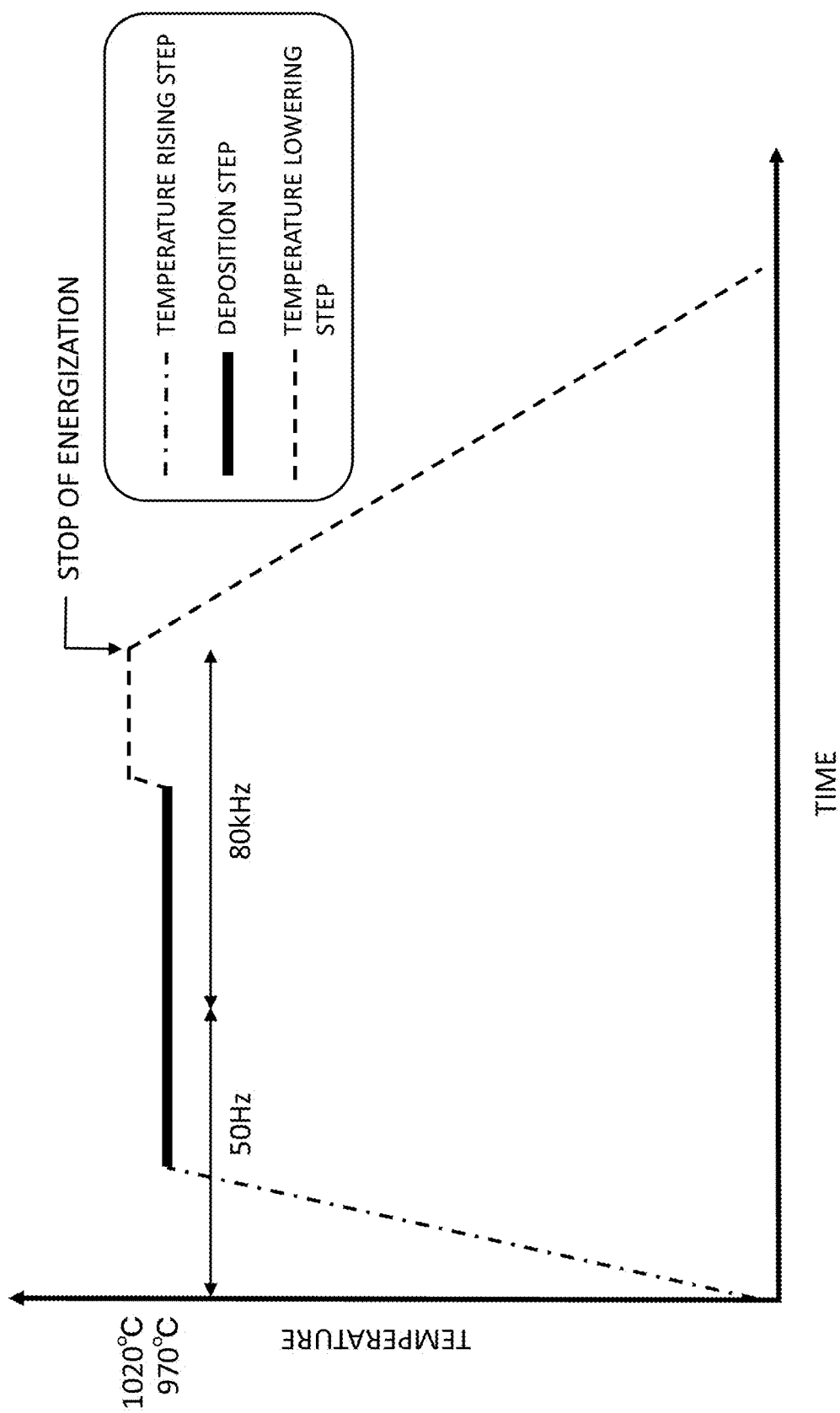
FIG. 2 is a view for conceptually explaining an outline of a process in a second example.

FIG. 2 is a view for conceptually explaining an outline of a process in a second example. A mixture of a trichlorosilane gas as a raw-material gas and a hydrogen gas was supplied and the temperature was kept at 970° C., so that a polycrystalline silicon rod having a diameter of 160 mm was grown by Siemens process. A frequency of current to be passed was set at a low frequency of 50 Hz until the diameter of a crystal became equal to 80 mm, and subsequently the frequency was changed to a high frequency of 80 kHz. After a deposition step of polycrystalline silicon ended, while the frequency was kept at 80 kHz, the polycrystalline silicon rod was heated so that the surface temperature thereof might reach 1020° C. in order to achieve energization under a condition that provides a skin depth D shallower than a skin depth $D_0$ provided at the end of the deposition step. The polycrystalline silicon rod was maintained in that state for one hour. Thereafter, energization was stopped and the polycrystalline silicon rod was cooled to a room temperature.

Third Example

Figure 3:
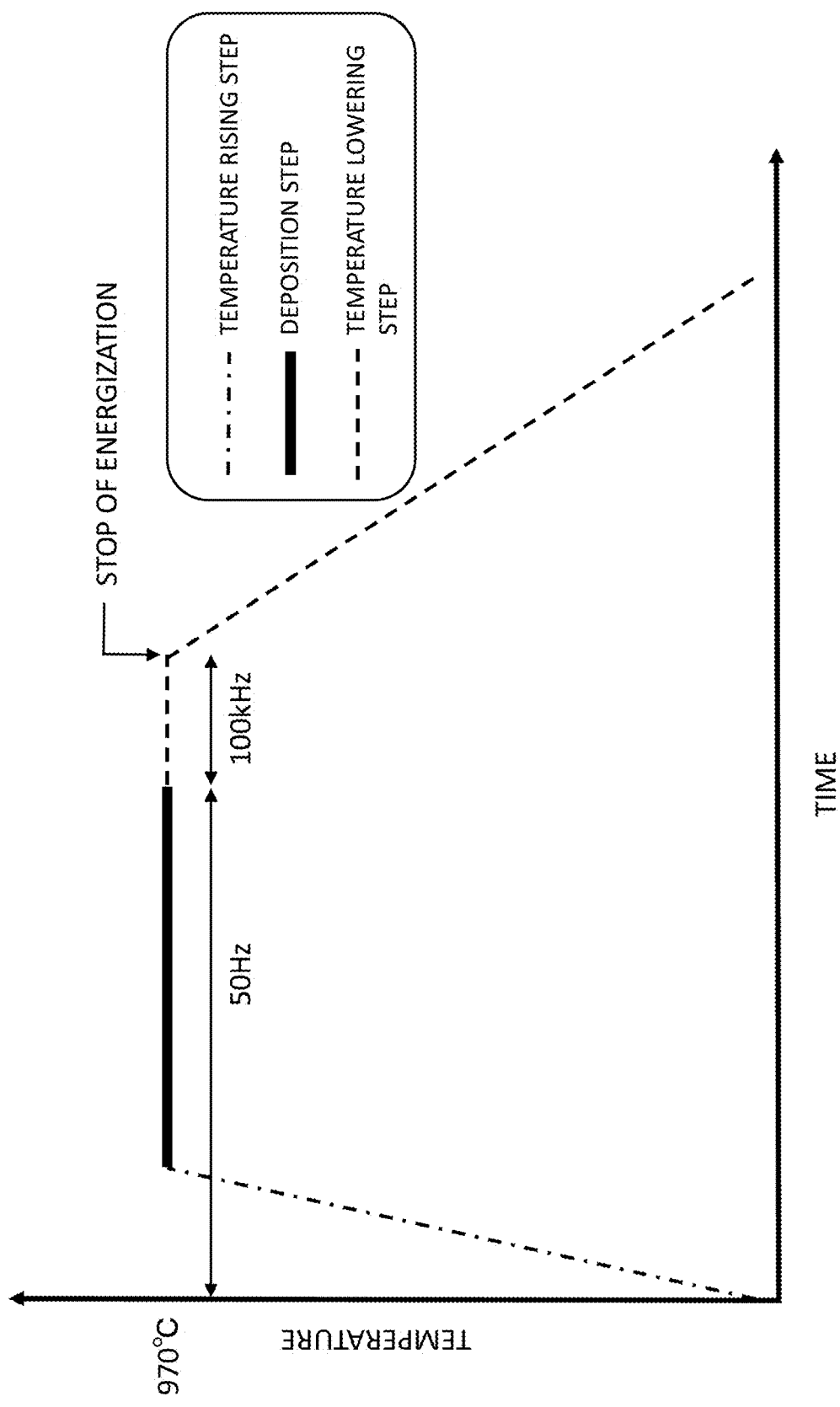
FIG. 3 is a view for conceptually explaining an outline of a process in a third example.

FIG. 3 is a view for conceptually explaining an outline of a process in a third example. A mixture gas of a trichlorosilane gas as a raw-material gas and a hydrogen gas was supplied and the temperature was kept at 970° C., so that a polycrystalline silicon rod having a diameter of 160 mm was grown by Siemens process. A frequency of current to be passed was set at a low frequency of 50 Hz at all times in a deposition step of polycrystalline silicon. After the deposition step ended, high-frequency current at 100 kHz was passed through the polycrystalline silicon rod for one hour. Thereafter, energization was stopped and the polycrystalline silicon rod was cooled to a room temperature.

Fourth Example

Figure 4:
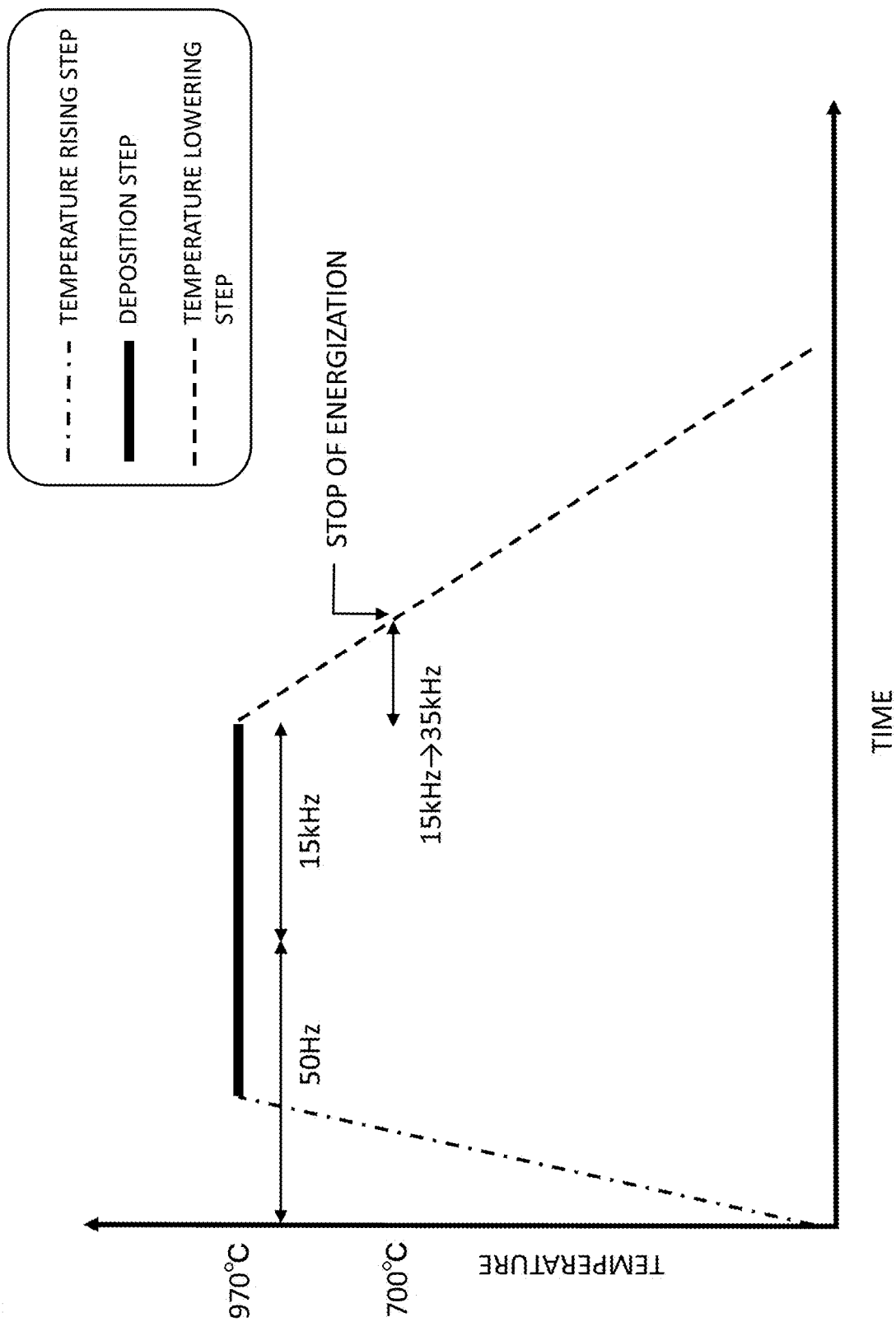
FIG. 4 is a view for conceptually explaining an outline of a process in a fourth example.

FIG. 4 is a view for conceptually explaining an outline of a process in a fourth example. A mixture gas of a trichlorosilane gas as a raw-material gas and a hydrogen gas was supplied and the temperature was kept at 970° C., so that a polycrystalline silicon rod having a diameter of 160 mm was grown by Siemens process. A frequency of current to be passed was set at a low frequency of 50 Hz until the diameter of a crystal became equal to 80 mm, and subsequently the frequency was changed to a high frequency of 15 kHz. After a deposition step of polycrystalline silicon ended, the frequency for energization was gradually changed from 15 kHz to 35 kHz during a period in which a surface temperature of the polycrystalline silicon rod was lowered from 970° C. to 700° C. in order to achieve energization under a condition that provides a skin depth D shallower than a skin depth $D_0$ provided at the end of the deposition step. Thereafter, energization was stopped and the polycrystalline silicon rod was cooled to a room temperature.

First Comparative Example

Figure 5:
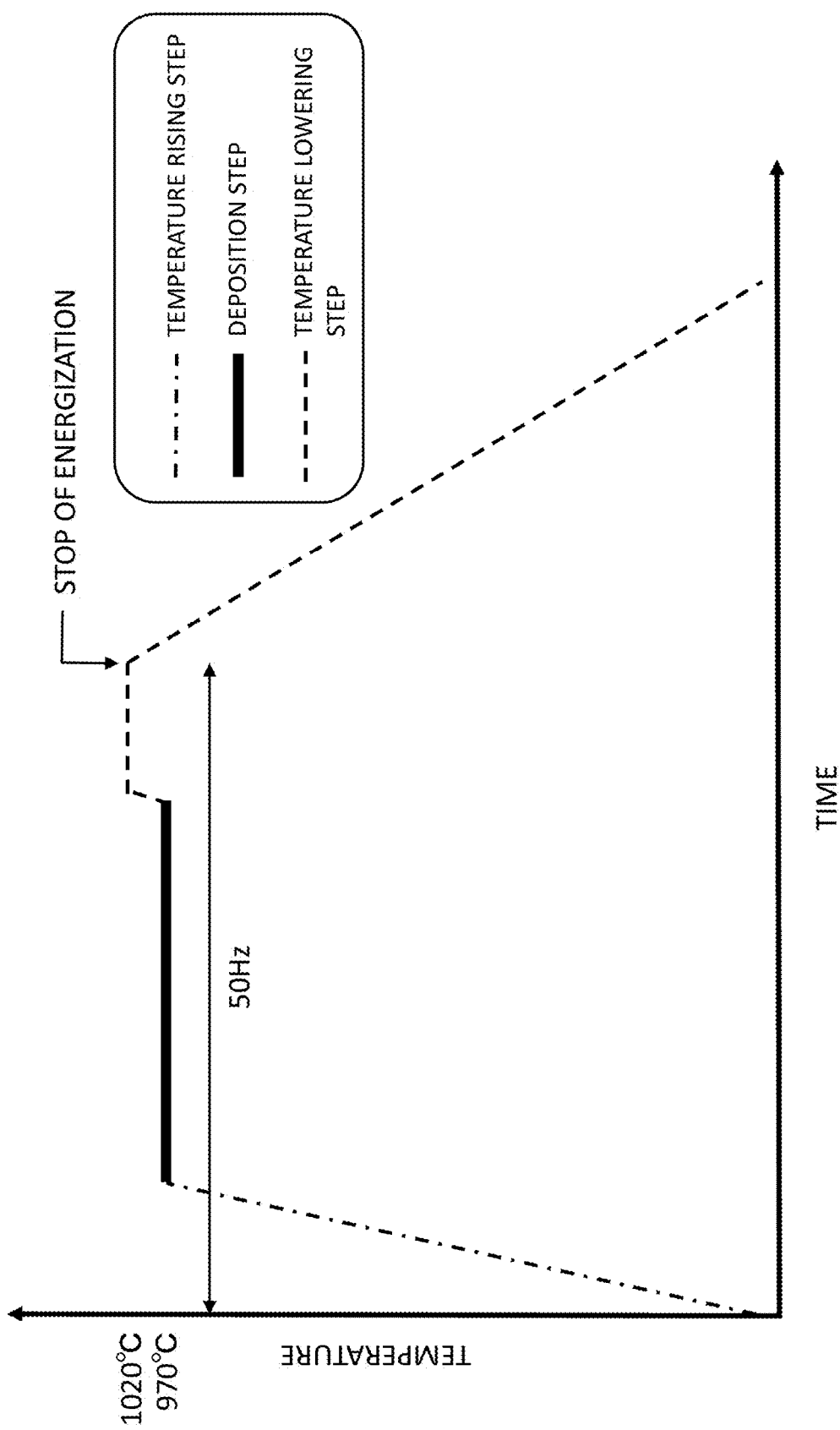
FIG. 5 is a view for conceptually explaining an outline of a process in a first comparative example.

FIG. 5 is a view for conceptually explaining an outline of a process in a first comparative example. A mixture gas of a trichlorosilane gas as a raw-material gas and a hydrogen gas was supplied and the temperature was kept at 970° C., so that a polycrystalline silicon rod having a diameter of 160 mm was grown by Siemens process. A frequency of current to be passed was set at a low frequency of 50 Hz at all times in a deposition step of polycrystalline silicon. After the deposition step of polycrystalline silicon ended, while the frequency for energization was kept at 50 Hz, the polycrystalline silicon rod was heated so that the surface temperature of the polycrystalline silicon rod might reach 1020° C. Then, the polycrystalline silicon rod was maintained in that state for one hour. Thereafter, energization was stopped and the polycrystalline silicon rod was cooled to a room temperature. Under the foregoing condition, a part of the polycrystalline silicon rod collapsed. It is considered that the reason is that a difference in temperature between the surface and the center of the polycrystalline silicon rod is increased due to rise in a crystal temperature during passage of low-frequency current at 50 Hz.

Second Comparative Example

Figure 6:
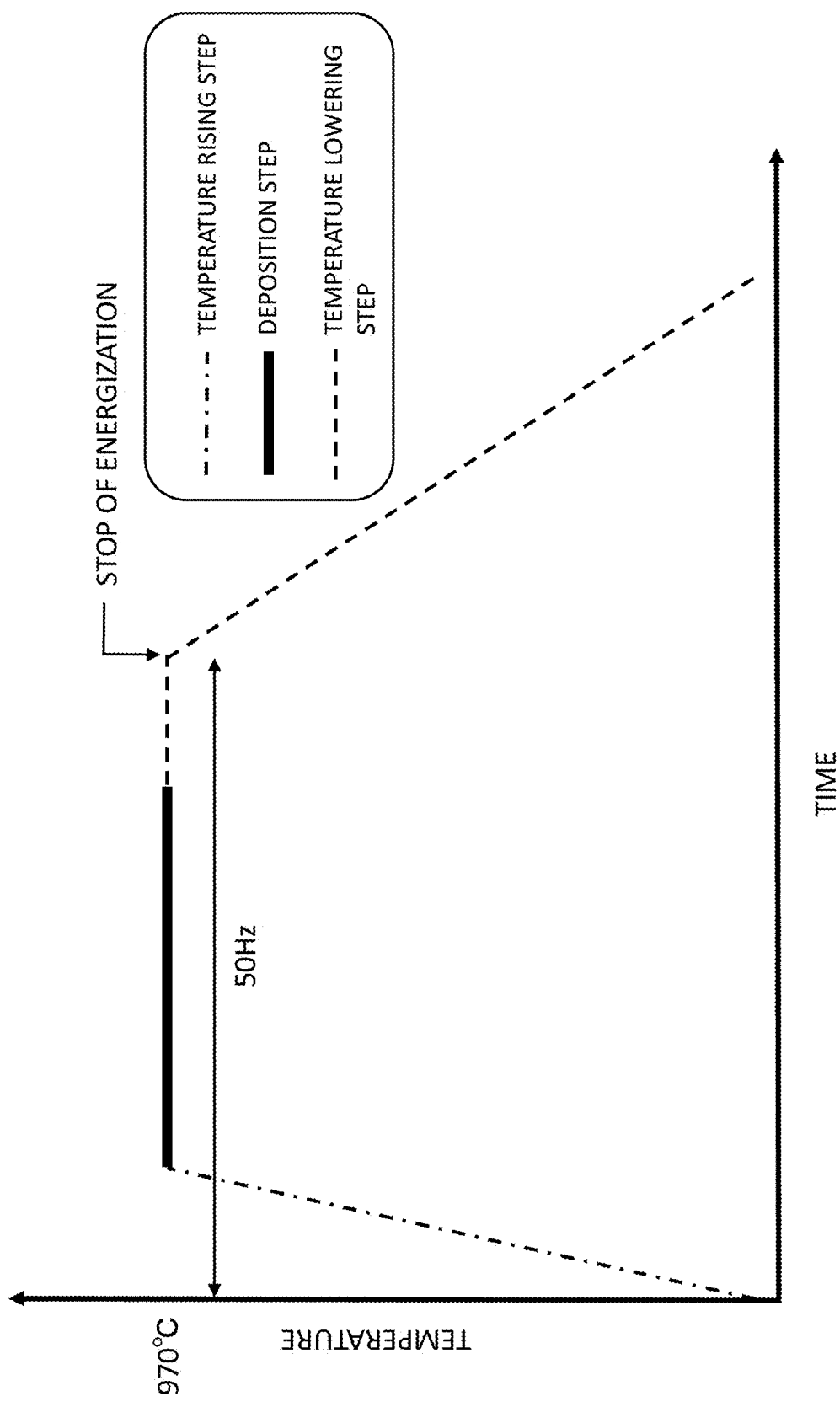
FIG. 6 is a view for conceptually explaining an outline of a process in a second comparative example.

FIG. 6 is a view for conceptually explaining an outline of a process in a second comparative example. A mixture gas of a trichlorosilane gas as a raw-material gas and a hydrogen gas was supplied and the temperature was kept at 970° C., so that a polycrystalline silicon rod having a diameter of 160 mm was grown by Siemens process. A frequency of current to be passed was set at a low frequency of 50 Hz at all times in a deposition step of polycrystalline silicon. After the deposition step of polycrystalline silicon ended, while the frequency for energization was kept at 50 Hz, the polycrystalline silicon rod was maintained in that state for one hour. Thereafter, energization was stopped and the polycrystalline silicon rod was cooled to a room temperature. Under this condition, cracks occurred considerably in the polycrystalline silicon rod. It is considered that the reason is that the polycrystalline silicon rod was cooled with a large difference in temperature between a surface and a central part thereof as a result of current flow in, and heating of, a central region of the polycrystalline silicon rod due to a start of the cooling during passage of low-frequency current at 50 Hz.

Third Comparative Example

Figure 7:
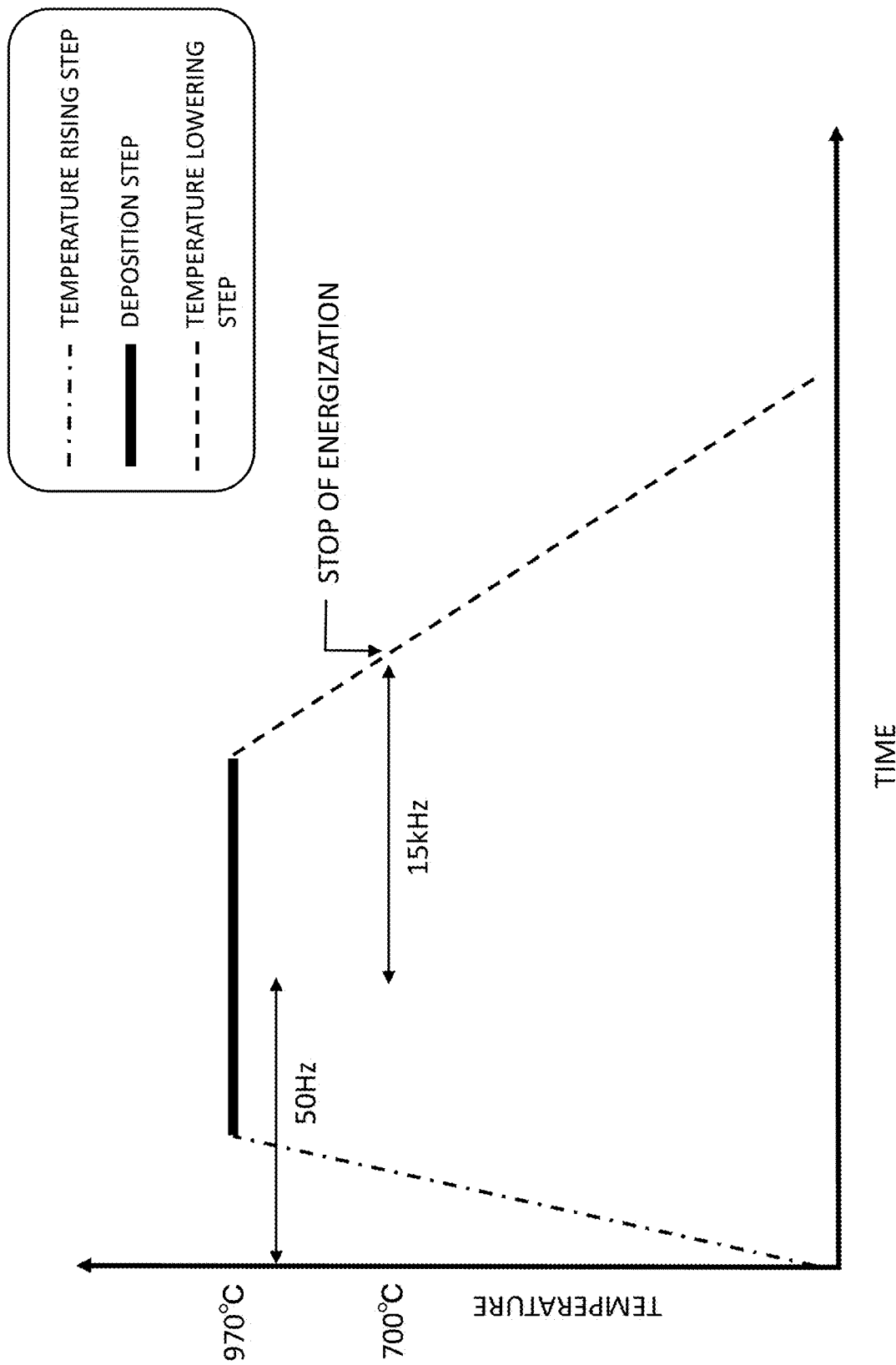
FIG. 7 is a view for conceptually explaining an outline of a process in a third comparative example.

FIG. 7 is a view for conceptually explaining an outline of a process in a third comparative example. A mixture gas of a trichlorosilane gas as a raw-material gas and a hydrogen gas was supplied and the temperature was kept at 970° C., so that a polycrystalline silicon rod having a diameter of 160 mm was grown by Siemens process. A frequency of current to be passed was set at a low frequency of 50 Hz until the diameter of a crystal became equal to 80 mm. Subsequently, the frequency was changed to a high frequency of 15 kHz. After a deposition step of polycrystalline silicon ended, the frequency for energization was kept at 15 kHz during a period in which the surface temperature of the polycrystalline silicon rod was lowered from 970° C. to 700° C. Thereafter, energization was stopped and the polycrystalline silicon rod was cooled to a room temperature.

Relative yields of obtained lengths of the polycrystalline silicon rods (relative yields of crystal lengths) in the above-described examples are tabulated in Table 1. The relative yield of crystal length referred to in this specification is a ratio of a length of a polycrystalline silicon rod that could be obtained in the form of a region having no crack in each example, to that (1.00) in the first example used as a reference.

In addition, each of the relative yields of crystal lengths tabulated in Table 1 is an average value of yields obtained from ten pairs of samples in each example.

TABLE 1

| | Example/Comparative example | | | | | | |
|---|---|---|---|---|---|---|---|
| | Example | | | | Comparative example | | |
| | First | Second | Third | Fourth | First | Second | Third |
| Relative yield of crystal length | 1.00 | 0.99 | 0.83 | 1.20 | 0.35 | 0.58 | 0.70 |

As shown in Table 1, a yield higher than 0.8 could be obtained in each of the examples. In contrast, in the comparative examples, a yield of 0.7 could be obtained at the highest.

Additionally, in the second example, a high yield of 0.99 was obtained. This is because the polycrystalline silicon rod was heated so that the surface temperature having been kept at 970° C. might reach 1020° C. at the end of the deposition step, which reduced a resistance value of the surface of the polycrystalline silicon rod, resulting in the skin depth D shallower than the skin depth $D_0$ provided at the end of the deposition step.

Further, even the yield that was obtained in the third comparative example and is the highest among the yields obtained in the comparative examples is still as low as 0.70. This is because in the third comparative example, the surface temperature of the polycrystalline silicon rod was lowered from 970° C. to 700° C. while the frequency for energization was kept at 15 kHz after the end of the deposition step of polycrystalline silicon, which increased a resistance value of the surface of the polycrystalline silicon rod, resulting in the skin depth D larger than the radius R of the polycrystalline silicon rod.

The present invention provides a method of manufacturing a polycrystalline silicon rod suitable as a raw material for manufacturing monocrystalline silicon by a FZ process, while effectively preventing occurrence of a crack or breakage.

What is claimed is:

1. A method of manufacturing a polycrystalline silicon rod by Siemens process, comprising:
    a deposition step, wherein a frequency of current is changed from a low frequency of the current to a first high frequency of the current at a point when a diameter of polycrystalline silicon reaches a predetermined diameter while a temperature of a surface of the polycrystalline silicon rod is maintained at a predetermined first temperature; and
    a cooling step after an end of the deposition step, wherein the frequency of current is gradually increased from the first high frequency of the current to a second high frequency of the current as a temperature of the polycrystalline silicon rod decreases until the temperature of the surface of the polycrystalline silicon rod reaches a predetermined second temperature from the predetermined first temperature, and wherein the current is stopped when the temperature of the surface of the polycrystalline silicon rod reaches the predetermined second temperature.

2. The method of manufacturing a polycrystalline silicon rod according to claim 1, wherein the low frequency is 50 to 60 Hz.

3. The method of manufacturing a polycrystalline silicon rod according to claim 1, wherein the predetermined second temperature is 700° C. or less.

* * * * *